United States Patent [19]

Imada

[11] Patent Number: 5,347,385
[45] Date of Patent: Sep. 13, 1994

[54] FREQUENCY-MULTIPLEX OPTICAL TRANSMISSION APPARATUS

[75] Inventor: Mitsutoshi Imada, Kanagawa, Japan

[73] Assignee: Sumitomo Electric Industries, Ltd., Osaka, Japan

[21] Appl. No.: 830,317

[22] Filed: Jan. 31, 1992

[30] Foreign Application Priority Data

Feb. 8, 1991 [JP] Japan .................. 3-17881

[51] Int. Cl.⁵ .................. H04J 14/00; H04B 10/00
[52] U.S. Cl. .................. 359/132; 359/187
[58] Field of Search .................. 359/132, 180, 187

[56] References Cited

U.S. PATENT DOCUMENTS

| | | | |
|---|---|---|---|
| 4,399,566 | 8/1983 | Roullet | 359/187 |
| 4,684,248 | 8/1987 | Cinzori | 359/159 |
| 4,796,301 | 1/1989 | Uzawa | 359/118 |
| 4,945,541 | 7/1990 | Nakayama . | |
| 5,107,362 | 4/1992 | Motoshima | 359/187 |

FOREIGN PATENT DOCUMENTS

| | | | |
|---|---|---|---|
| 56-051119 | 5/1981 | Japan . | |
| 57-199347 | 12/1982 | Japan . | |
| 59-14143 | 1/1984 | Japan . | |
| 0226925 | 9/1990 | Japan | 359/187 |

OTHER PUBLICATIONS

Albin et al, "Design and Operation of High–Frequency Lightwave Sources and Receivers", Hewlett–Packard Journal, vol. 40, No. 3, Jun. 1989, pp. 52–57.

*Primary Examiner*—Leslie Pascal
*Attorney, Agent, or Firm*—Cushman, Darby & Cushman

[57] ABSTRACT

A frequency-multiplex optical transmission apparatus for carrying out frequency-multiplex optical transmission by supplying an analog-frequency-multiplexed RF input signal to a laser diode. In the apparatus, part of the RF input signal taken out by a splitter is detected by a power detector. In response to an output signal of the power detector, an indicator driver causes an indicator to indicate a modulation signal level for the laser diode. The level of the RF input signal is adjustable by an attenuator while observing the indication state of the indicator.

14 Claims, 2 Drawing Sheets

FREQUENCY-MULTIPLEX OPTICAL TRANSMISSION APPARATUS

BACKGROUND OF THE INVENTION

1. Field of the Invention

The present invention relates to a frequency-multiplex optical transmission apparatus having a function of indicating a modulation signal level. More specifically, the present invention relates to a frequency-multiplex optical transmission apparatus having a circuit for indicating a modulation signal level of a laser diode for carrying out analog frequency-multiplex optical transmission.

2. Discussion of the Related Art

FIG. 3 is a diagram illustrating the characteristic of the optical output ($P_O$) of a laser diode with respect to the drive current ($I_{LD}$) thereof, and the relation between a waveform of the drive current and a waveform of the optical output.

In such a laser diode, the modulation degree m of the laser diode is expressed as follows:

$$m = I_n/(I_{op} - I_{th})$$

wherein $I_n$ represents an amplitude value, $I_{op}$ represents an operating point value, and $I_{th}$ represents a threshold value, in the drive current of the laser diode respectively.

Incidentally, in the case of a frequency-multiplexed signal, for instance, the modulation degrees of approximately 5% per channel for 40 transmission channels, and of approximately 10% per channel for 20 transmission channels have heretofore been known experimentally.

In this case, the voltage amount of the modulation signal applied to the laser diode has been measured to obtain the modulation degree.

FIG. 4 is a diagram showing an example of a conventional frequency-multiplex optical transmission apparatus. In this figure, an analog-frequency-multiplexed RF input signal from an input terminal 1 is applied to a laser diode 5 through an RF attenuator 2, an RF amplifier 3, and a splitter 4. The RF signal output from the amplifier 3 is splitted into an output terminal 6 by the splitter 4. When the laser diode 5 is subjected to optimum modulation, adjustment of the modulation signal level has been performed by measuring the RF signal at the output terminal 6 with a measuring instrument (not shown) such as a spectrum analyzer.

Due to measurement errors attributable to different measuring instruments, however, the adjusted modulation signal level tends to deviate from the optimum value thereof, resulting in deep modulation or shallow modulation to the laser diode 5.

SUMMARY OF THE INVENTION

An object of the present invention is to provide a frequency-multiplex optical transmission apparatus having a circuit for indicating a modulation signal level so that a laser diode may be subjected to optimum modulation all the time with respect to an analog-frequency-multiplexed RF input signal, irrespective of the contents of modulation and the number of transmission channels.

A frequency-multiplex optical transmission apparatus according to the present invention, which carries out frequency-multiplex optical transmission by supplying an analog-frequency-multiplexed RF input signal to a laser diode, includes split means for taking out part of the RF input signal; detection means for detecting the RF input signal obtained from the split means; and drive means for causing an indicator to indicate a modulation signal level for the laser diode in response to an output signal of the detection means.

DETAILED DESCRIPTION OF THE PREFERRED EMBODIMENT

Figure 1:
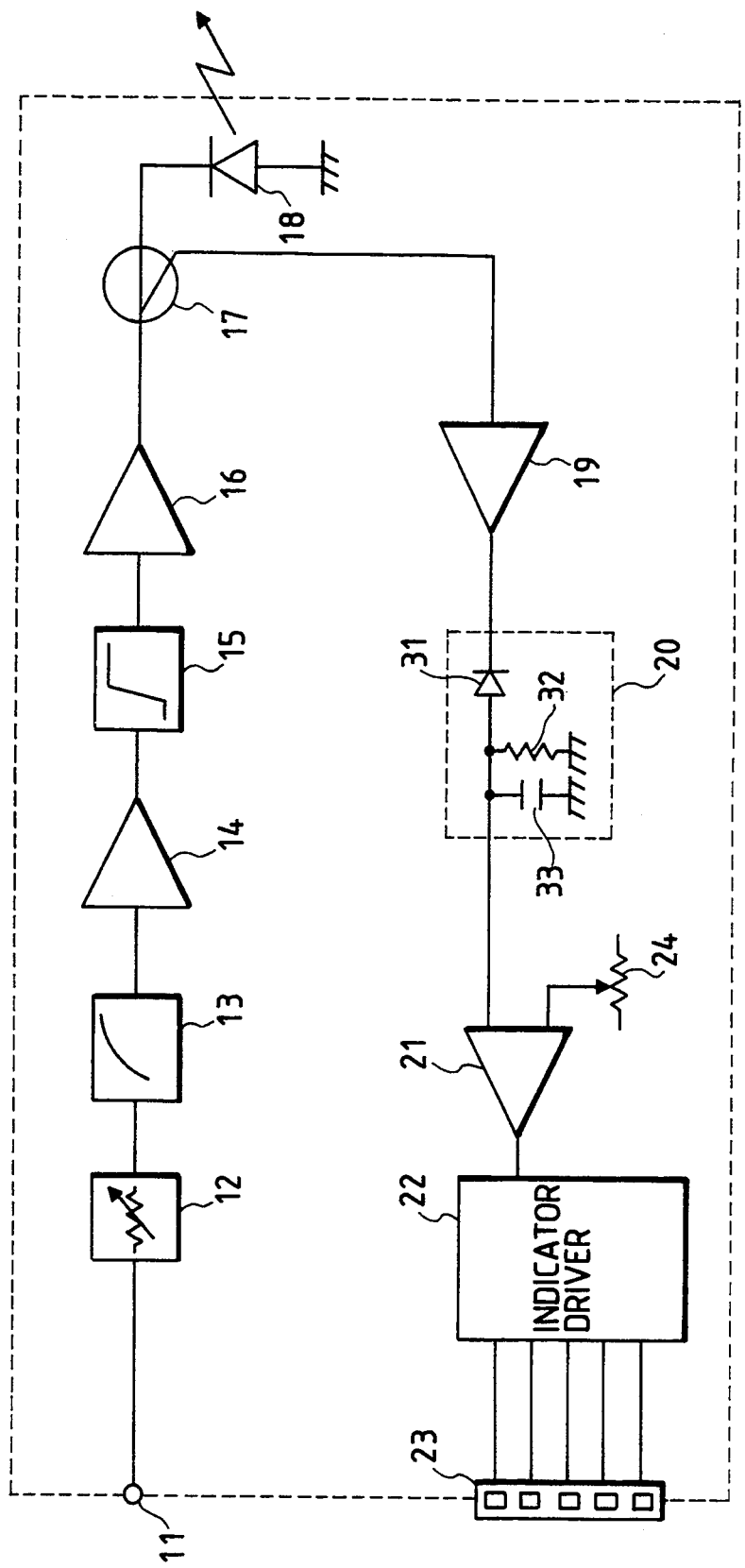
FIG. 1 is a block diagram showing a frequency-multiplex optical transmission apparatus according to an embodiment of the present invention.
Figure 2:
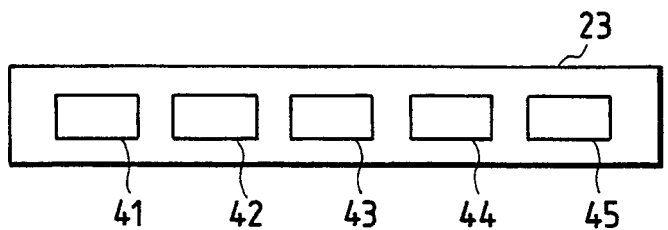
FIG. 2 is an enlarged view showing an indicator of FIG. 1.
Figure 3:
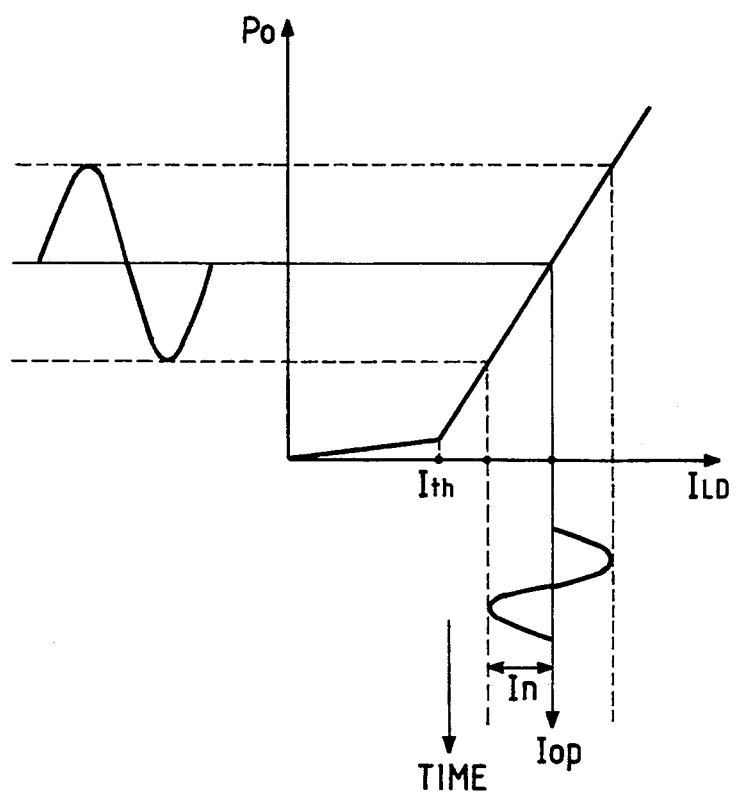
FIG. 3 is a diagram illustrating the characteristic of the optical output of a laser diode with respect to the drive current thereof, and the relation between a waveform of the drive current and a waveform of the optical output.
Figure 4:
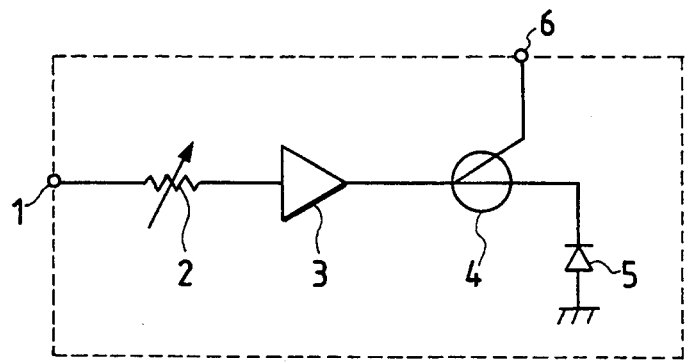
FIG. 4 is a diagram showing an example of a conventional frequency-multiplex optical transmission apparatus.

FIG. 1 is a block diagram showing a frequency-multiplex optical transmission apparatus according to an embodiment of the present invention. In FIG. 1, an analog-frequency-multiplexed RF input signal from an input terminal 11 is applied to a laser diode 18 through an RF attenuator 12, an equalizer 13, an RF amplifier 14, a high-pass filter 15, an RF amplifier 16, and a splitter 17. The RF attenuator 12 is used for adjusting the level of the modulation signal applied to the laser diode 18. The RF signal output from the amplifier 16 is splitted by the splitter 17 such as a split transformer and supplied to an RF power detector 20 through an RF amplifier 19. The RF power detector 20 is constituted by a diode 31, a resistor 32, and a capacitor 33. In the RF power detector 20, the total amount of power for all channels is detected. The output signal of the RF power detector 20 is supplied to an indicator driver 22 through an amplifier 21 of which the amplification level is adjusted by a variable resistor 24, to cause an indicator 23 to indicate the modulation signal level to the laser diode 18. The indicator 23 is constituted by five light emitting diodes (LEDs) 41 to 45 as shown in FIG. 2. Further, the variable resistor 24 has to be adjusted previously so as to cause the indicator 23 to indicate properly.

In the apparatus thus constructed, the central LED 43 is lighted when the level of the modulation signal applied to the laser diode 18 is optimum. The LED 42 on the left of the LED 43 is lighted when the modulation signal level is lower than the optimum value, that is shallow modulation. Further, the LED 41 on the left of the LED 42 is lighted when the modulation signal level is still lower than the optimum value. To the contrary, the LED 44 on the right of the LED 43 is lighted when the modulation signal level is higher than the optimum value, that is deep modulation. Further, the LED 45 on the right of the LED 44 is lighted when the modulation signal level is still higher than the optimum value.

Consequently, Even when a signal different in the number of transmission channels (40 channels or 20 channels) is applied as the input signal, an optimum modulation signal level for the laser diode 18 can be obtained by adjusting the attenuator 12 while observing the indication state of the indicator 23.

Although the indicator 23 is constituted by the five LEDs in the above-described embodiment, the indicator 23 may be constituted by a single LED which is to be lighted when the modulation signal level is the optimum value.

According to the present invention, when the laser diode is subjected to optimum modulation, adjustment is readily made since the only thing to do is to adjust the attenuator while observing the indicating state of the indicator. Moreover, since the adjustment of the modulation signal level in not affected by errors resulting from using any measuring instrument, it is possible to obtain transmission signal quality in conformity with the specification required.

I claim:

1. An apparatus for carrying out frequency-multiplex optical transmissions, comprising:

means for supplying an analog-frequency-multiplexed RF input signal to a laser diode;

split means for taking out part of the RF input signal before being supplied to said laser diode;

detection means for detecting the RF input signal obtained from the split means;

an indicator; and drive means for causing the indicator to indicate a modulation signal level of the laser diode on the basis of a modulation signal level of said RF input signal obtained from an output signal of the detection means.

2. The apparatus according to claim 1, further comprising level adjustment means for adjusting a level of the RF input signal prior to the taking out operation of said split means.

3. The apparatus according to claim 2, wherein the level adjustment means includes an attenuator.

4. The apparatus according to claim 1, wherein the split means includes a split transformer.

5. The apparatus according to claim 1, wherein the detection means includes an RF power detector.

6. The apparatus according to claim 5, wherein the RF power detector consists of a diode, a resistor, and a capacitor.

7. The apparatus according to claim 1, wherein the indicator includes a plurality of light emitting diodes, and said drive means causes a designated one of the light emitting diodes to light when the modulation signal level to the laser diode is an optimum value based on the output signal.

8. The apparatus according to claim 7, wherein the driving means causes light emitting diodes other than the designated light emitting diode to light when the modulation signal level to the laser diode is not an optimum value based on the output signal.

9. The apparatus according to claim 1, wherein indicator includes a single light emitting diode, and said drive means causes said single light emitting diode to light when the modulation signal level to the laser diode is an optimum value based on the output signal.

10. The apparatus according to claim 1, wherein the indicator includes a plurality of light emitting diodes, each diode corresponding to a different level of signal modulation.

11. The apparatus according to claim 10, wherein the driving means drives the light emitting diodes to indicate optimum modulation, deep modulation, and shallow modulation based on the output signal.

12. The apparatus according to claim 1, wherein the indicator includes a plurality of light emitting diodes, the plurality of light emitting diodes include a centrally positioned light emitting diode and at least one light emitting diode positioned on a first and second side of the centrally positioned light emitting diode.

13. The apparatus of claim 12, wherein the drive means causes the centrally positioned light emitting diode to light when the modulation signal level is an optimum value based on the output signal.

14. The apparatus of claim 13, wherein the driving means causes the light emitting diode positioned on a first side of the centrally positioned diode to light when the modulation signal level is lower than the optimum value, and the light emitting diode positioned on the second side of the centrally positioned diode to light when the modulation signal level is higher than the value optimum based on the output signal.

* * * * *